(12) United States Patent
Tamate

(10) Patent No.: US 11,888,535 B2
(45) Date of Patent: Jan. 30, 2024

(54) POWERED DEVICE AND POWER OVER FIBER SYSTEM

(71) Applicant: KYOCERA CORPORATION, Kyoto (JP)

(72) Inventor: Shuichi Tamate, Hino (JP)

(73) Assignee: KYOCERA CORPORATION, Kyoto (JP)

( * ) Notice: Subject to any disclaimer, the term of this patent is extended or adjusted under 35 U.S.C. 154(b) by 170 days.

(21) Appl. No.: 17/612,214

(22) PCT Filed: May 20, 2020

(86) PCT No.: PCT/JP2020/019968
§ 371 (c)(1),
(2) Date: Nov. 18, 2021

(87) PCT Pub. No.: WO2020/255612
PCT Pub. Date: Dec. 24, 2020

(65) Prior Publication Data
US 2022/0224421 A1 Jul. 14, 2022

(30) Foreign Application Priority Data
Jun. 20, 2019 (JP) .................. 2019-114746

(51) Int. Cl.
*H04B 10/00* (2013.01)
*H04B 10/80* (2013.01)
*H02S 10/30* (2014.01)

(52) U.S. Cl.
CPC ........... *H04B 10/807* (2013.01); *H02S 10/30* (2014.12)

(58) Field of Classification Search
CPC .............. H04B 10/807; H04B 10/806; H04B 10/808; H04B 10/40; H04B 10/2507; H04B 10/0795; H04B 10/07955; H04B 10/616; H04B 10/691; H04B 10/503; H02S 10/30
USPC ....... 398/171, 158, 159, 135, 136, 137, 138, 398/139, 140, 141, 33, 38, 208, 209, 79, 398/162
See application file for complete search history.

(56) References Cited

U.S. PATENT DOCUMENTS

| | | | | |
|---|---|---|---|---|
| 4,998,294 | A | * | 3/1991 | Banks ..................... H02J 50/30 398/171 |
| 9,838,143 | B2 | * | 12/2017 | Chan ....................... H04J 14/02 |
| 2013/0328416 | A1 | * | 12/2013 | Whitworth ............... F03G 5/06 307/149 |
| 2018/0302022 | A1 | * | 10/2018 | Hu ........................... C07C 1/12 |

FOREIGN PATENT DOCUMENTS

| | | |
|---|---|---|
| JP | H11230856 A | 8/1999 |
| JP | 2010135989 A | 6/2010 |
| JP | 2018528751 A | 9/2018 |

* cited by examiner

*Primary Examiner* — Hanh Phan
(74) *Attorney, Agent, or Firm* — HAUPTMAN HAM, LLP

(57) ABSTRACT

A powered device includes a photoelectric conversion element, a thermoelectric conversion element and a first power line. The photoelectric conversion element receives and converts feed light into electric power. The thermoelectric conversion element is disposed such that heat can be conducted thereto from the photoelectric conversion element. The first power line transmits, to a load, electric power obtained by conversion by the thermoelectric conversion element.

12 Claims, 5 Drawing Sheets

POWERED DEVICE AND POWER OVER FIBER SYSTEM

RELATED APPLICATIONS

The present application is a National Phase of International Application No. PCT/JP2020/019968 filed May 20, 2020, and claims priority based on Japanese Patent Application No. 2019-114746 filed Jun. 20, 2019.

TECHNICAL FIELD

The present disclosure relates to a powered device and a power over fiber system.

BACKGROUND ART

Recently, there has been studied an optical power supply system that converts electric power into light (called feed light), transmits the feed light, converts the feed light into electric energy, and uses the electric energy as electric power. There is disclosed in Patent Literature 1 an optical communication device that includes: an optical transmitter that transmits signal light modulated with an electric signal and feed light for supplying electric power; an optical fiber including a core that transmits the signal light, a first cladding that is formed around the core, has a refractive index lower than that of the core, and transmits the feed light, and a second cladding that is formed around the first cladding, and has a refractive index lower than that of the first cladding; and an optical receiver that operates with electric power obtained by converting the feed light transmitted through the first cladding of the optical fiber, and converts the signal light transmitted through the core of the optical fiber into the electric signal.

CITATION LIST

Patent Literature

Patent Literature 1: JP 2010-135989 A

SUMMARY OF INVENTION

Problem to Solve

In optical power supply, a photoelectric conversion element generates heat due to loss in conversion into electric power. Further, in optical power supply, it is difficult to increase or decrease intensity of feed light according to increase or decrease of load. If excess feed light is input, it is converted into heat by the photoelectric conversion element, which results in energy loss.

Solution to Problem

A powered device of the present disclosure includes:
- a photoelectric conversion element that receives and converts feed light into electric power;
- a thermoelectric conversion element disposed such that heat can be conducted thereto from the photoelectric conversion element; and
- a first power line that transmits, to a load, electric power obtained by conversion by the thermoelectric conversion element.

A power over fiber system of the present disclosure includes:
- a power sourcing equipment that transmits feed light through an optical fiber; and
- the above powered device that receives the feed light through the optical fiber.

DESCRIPTION OF EMBODIMENTS

Hereinafter, embodiments of the present disclosure will be described with reference to the drawings.

(1) Outline of System

First Embodiment

Figure 1:
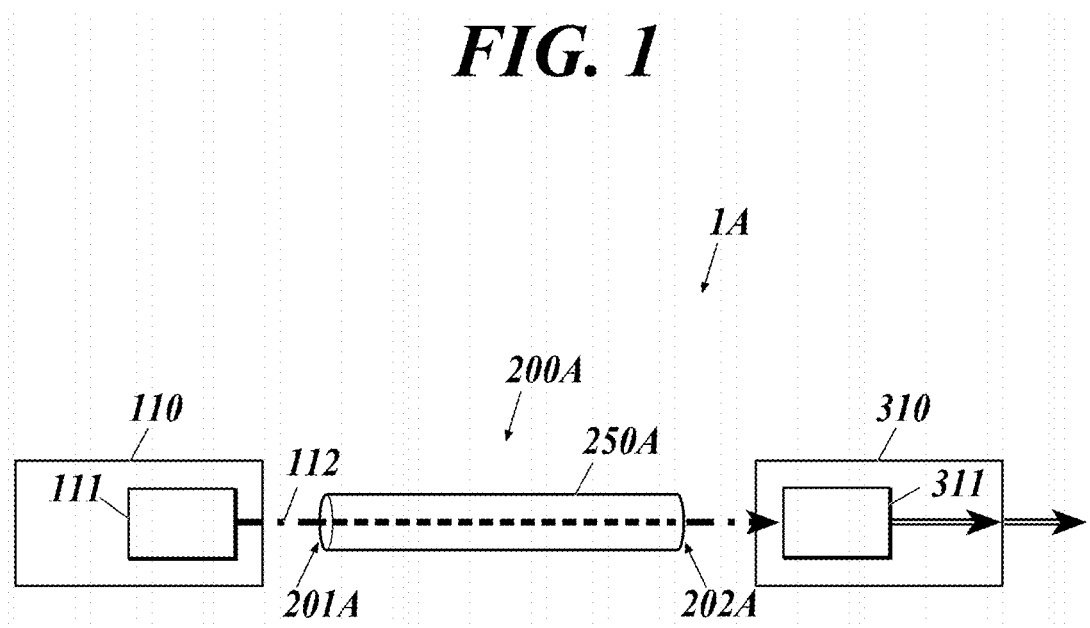
FIG. 1 is a block diagram of a power over fiber system according to a first embodiment of the present disclosure.

As shown in FIG. 1, a power over fiber (PoF) system 1A of this embodiment includes a power sourcing equipment (PSE) 110, an optical fiber cable 200A and a powered device (PD) 310.

In the present disclosure, a power sourcing equipment converts electric power into optical energy and supplies (sources) the optical energy, and a powered device receives (draws) the supplied optical energy and converts the optical energy into electric power.

The power sourcing equipment 110 includes a semiconductor laser 111 for power supply.

The optical fiber cable 200A includes an optical fiber 250A that forms a transmission path of feed light.

The powered device 310 includes a photoelectric conversion element 311.

The power sourcing equipment 110 is connected to a power source, and electrically drives the semiconductor laser 111 and so forth.

The semiconductor laser 111 oscillates with the electric power from the power source, thereby outputting feed light 112.

The optical fiber cable 200A has one end 201A connectable to the power sourcing equipment 110 and the other end 202A connectable to the powered device 310 to transmit the feed light 112.

The feed light 112 from the power sourcing equipment 110 is input to the one end 201A of the optical fiber cable 200A, propagates through the optical fiber 250A, and is output from the other end 202A of the optical fiber cable 200A to the powered device 310.

The photoelectric conversion element 311 converts the feed light 112 transmitted through the optical fiber cable 200A into electric power. The electric power obtained by the conversion of the feed light 112 by the photoelectric conversion element 311 is driving power needed in the powered device 310. The powered device 310 is capable of outputting, for an external device(s), the electric power obtained by the conversion of the feed light 112 by the photoelectric conversion element 311.

Semiconductor materials of semiconductor regions of the semiconductor laser 111 and the photoelectric conversion element 311 are semiconductors having a laser wavelength being a short wavelength of 500 nm or less. The semiconductor regions exhibit light-electricity conversion effect.

Semiconductors having a laser wavelength being a short wavelength have a large band gap and a high photoelectric conversion efficiency, and hence improve photoelectric conversion efficiency at the power supplying side and the power receiving side in optical power supply, and improve optical power supply efficiency.

Hence, as the semiconductor materials, laser media having a laser wavelength (base wave) of 200 nm to 500 nm may be used. Examples thereof include diamond, gallium oxide, aluminum nitride and gallium nitride.

Further, as the semiconductor materials, semiconductors having a band gap of 2.4 eV or greater are used.

For example, laser media having a band gap of 2.4 eV to 6.2 eV may be used. Examples thereof include diamond, gallium oxide, aluminum nitride and gallium nitride.

Laser light having a longer wavelength tends to have a higher transmission efficiency, whereas laser light having a shorter wavelength tends to have a higher photoelectric conversion efficiency. Hence, when laser light is transmitted for a long distance, laser media having a laser wavelength (base wave) of greater than 500 nm may be used as the semiconductor materials, whereas when the photoelectric conversion efficiency is given priority, laser media having a laser wavelength (base wave) of less than 200 nm may be used as the semiconductor materials.

Any of these semiconductor materials may be used in one of the semiconductor laser 111 and the photoelectric conversion element 311. This improves the photoelectric conversion efficiency at either the power supplying side or the power receiving side, and improves the optical power supply efficiency.

Second Embodiment

Figure 2:
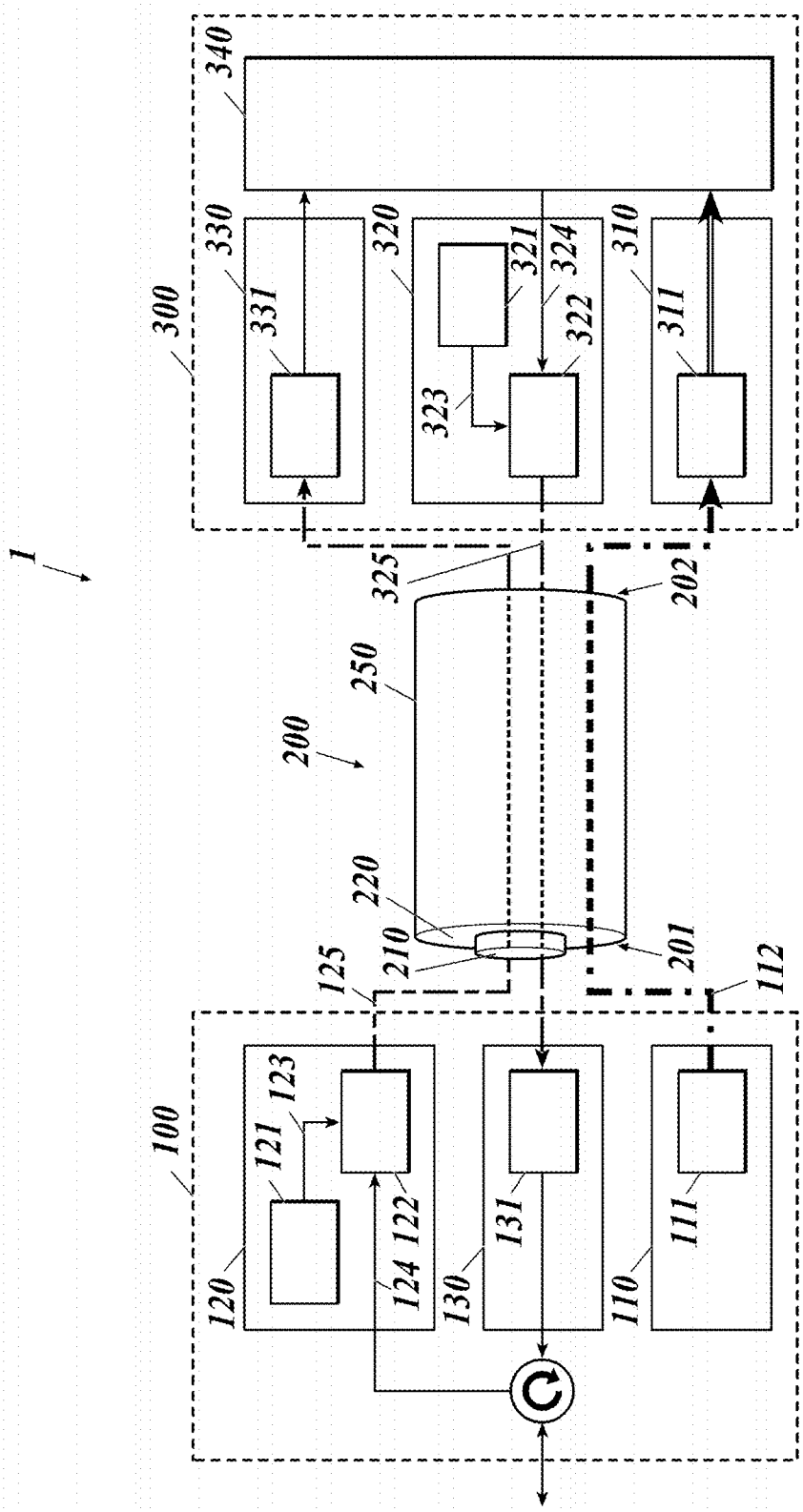
FIG. 2 is a block diagram of a power over fiber system according to a second embodiment of the present disclosure.

As shown in FIG. 2, a power over fiber (PoF) system 1 of this embodiment includes a power supply system through an optical fiber and an optical communication system therethrough, and includes: a first data communication device 100 including a power sourcing equipment (PSE) 110; an optical fiber cable 200; and a second data communication device 300 including a powered device (PD) 310.

The power sourcing equipment 110 includes a semiconductor laser 111 for power supply. The first data communication device 100 includes, in addition to the power sourcing equipment 110, a transmitter 120 and a receiver 130 for data communication. The first data communication device 100 corresponds to a data terminal equipment (DTE), a repeater or the like. The transmitter 120 includes a semiconductor laser 121 for signals and a modulator 122. The receiver 130 includes a photodiode 131 for signals.

The optical fiber cable 200 includes an optical fiber 250 including: a core 210 that forms a transmission path of signal light; and a cladding 220 that is arranged so as to surround the core 210 and forms a transmission path of feed light.

The powered device 310 includes a photoelectric conversion element 311. The second data communication device 300 includes, in addition to the powered device 310, a transmitter 320, a receiver 330 and a data processing unit 340. The second data communication device 300 corresponds to a power end station or the like. The transmitter 320 includes a semiconductor laser 321 for signals and a modulator 322. The receiver 330 includes a photodiode 331 for signals. The data processing unit 340 processes received signals. The second data communication device 300 is a node in a communication network. The second data communication device 300 may be a node that communicates with another node.

The first data communication device 100 is connected to a power source, and electrically drives the semiconductor laser 111, the semiconductor laser 121, the modulator 122, the photodiode 131 and so forth. The first data communication device 100 is a node in a communication network. The first data communication device 100 may be a node that communicates with another node.

The semiconductor laser 111 oscillates with the electric power from the power source, thereby outputting feed light 112.

The photoelectric conversion element 311 converts the feed light 112 transmitted through the optical fiber cable 200 into electric power. The electric power obtained by the conversion of the feed light 112 by the photoelectric conversion element 311 is driving power needed in the second data communication device 300, for example, driving power for the transmitter 320, the receiver 330 and the data processing unit 340. The second data communication device 300 may be capable of outputting, for an external device(s), the electric power obtained by the conversion of the feed light 112 by the photoelectric conversion element 311.

The modulator 122 of the transmitter 120 modulates laser light 123 output by the semiconductor laser 121 to signal light 125 on the basis of transmission data 124, and outputs the signal light 125.

The photodiode 331 of the receiver 330 demodulates the signal light 125 transmitted through the optical fiber cable 200 to an electric signal, and outputs the electric signal to the data processing unit 340. The data processing unit 340 transmits data of the electric signal to a node, and also receives data from the node and outputs the data to the modulator 322 as transmission data 324.

The modulator 322 of the transmitter 320 modulates laser light 323 output by the semiconductor laser 321 to signal light 325 on the basis of the transmission data 324, and outputs the signal light 325.

The photodiode 131 of the receiver 130 demodulates the signal light 325 transmitted through the optical fiber cable 200 to an electric signal, and outputs the electric signal. Data of the electric signal is transmitted to a node, whereas data from the node is the transmission data 124.

The feed light 112 and the signal light 125 from the first data communication device 100 are input to one end 201 of the optical fiber cable 200, propagate through the cladding 220 and the core 210, respectively, and are output from the other end 202 of the optical fiber cable 200 to the second data communication device 300.

The signal light 325 from the second data communication device 300 is input to the other end 202 of the optical fiber cable 200, propagates through the core 210, and is output from the one end 201 of the optical fiber cable 200 to the first data communication device 100.

Figure 3:
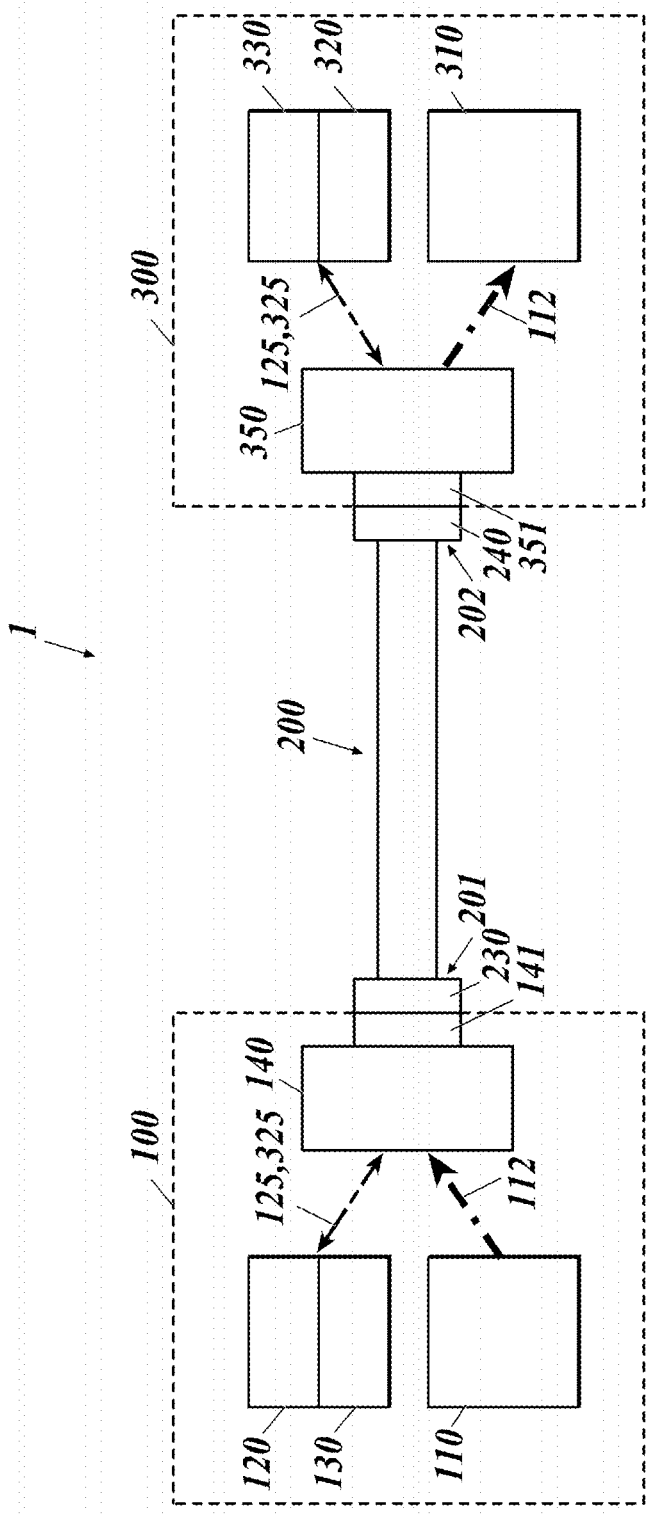
FIG. 3 is a block diagram of the power over fiber system according to the second embodiment of the present disclosure and shows optical connectors and so forth.

As shown in FIG. 3, the first data communication device 100 includes a light input/output part 140 and an optical connector 141 attached to the light input/output part 140, and the second data communication device 300 includes a light input/output part 350 and an optical connector 351 attached to the light input/output part 350. An optical connector 230 provided at the one end 201 of the optical fiber cable 200 is connected to the optical connector 141, and an optical connector 240 provided at the other end 202 of the optical fiber cable 200 is connected to the optical connector 351. The light input/output part 140 guides the feed light 112 to the cladding 220, guides the signal light 125 to the core 210, and guides the signal light 325 to the receiver 130. The light input/output part 350 guides the feed light 112 to the powered device 310, guides the signal light 125 to the receiver 330, and guides the signal light 325 to the core 210.

As described above, the optical fiber cable 200 has the one end 201 connectable to the first data communication device 100 and the other end 202 connectable to the second data communication device 300 to transmit the feed light 112. In this embodiment, the optical fiber cable 200 transmits the signal light 125, 325 bidirectionally.

As the semiconductor materials of the semiconductor regions, which exhibit the light-electricity conversion effect, of the semiconductor laser 111 and the photoelectric conversion element 311, any of those described in the first embodiment can be used, thereby achieving a high optical power supply efficiency.

Figure 4:
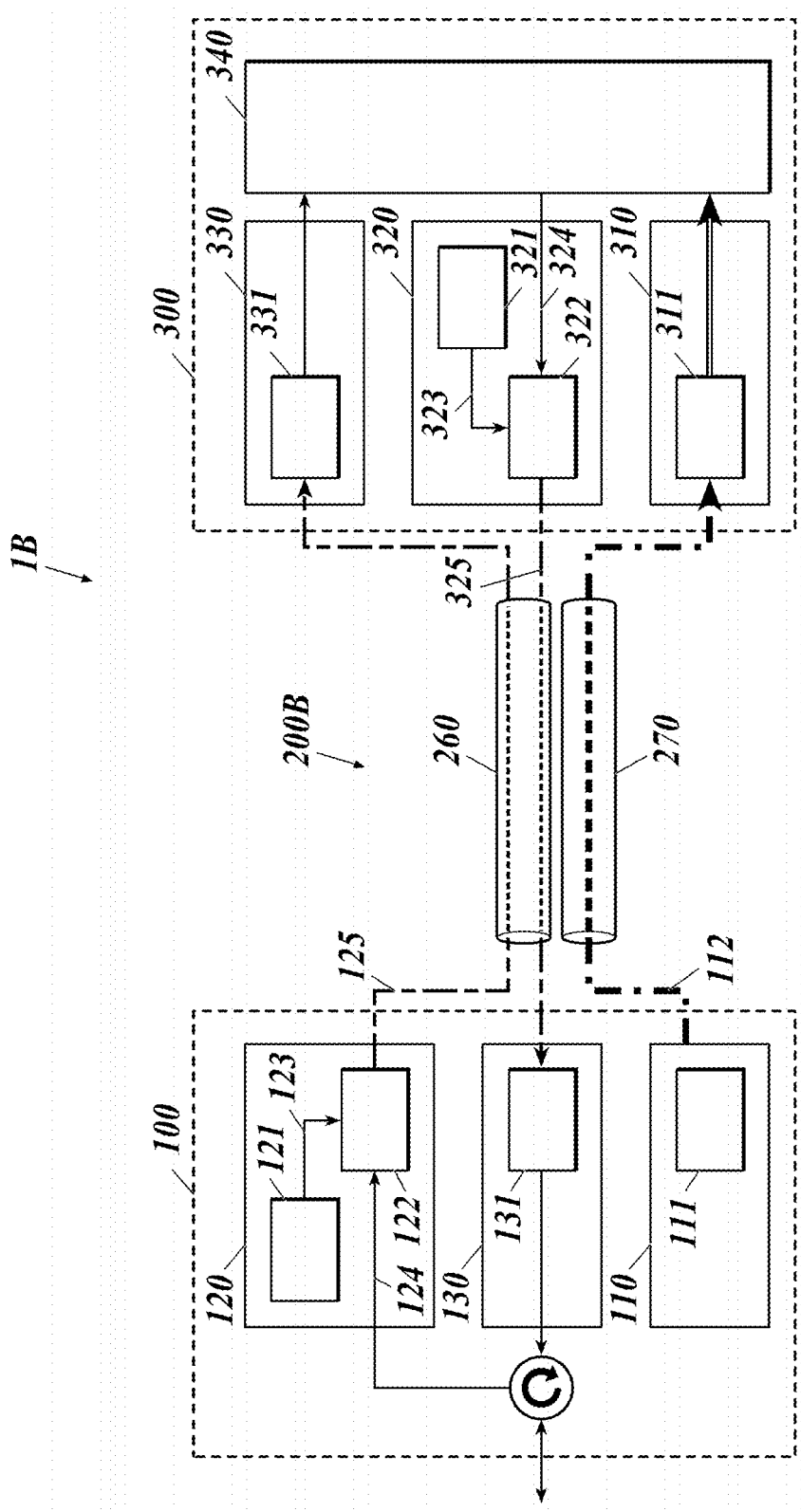
FIG. 4 is a block diagram of a power over fiber system according to another embodiment of the present disclosure.

Like an optical fiber cable 200B of a power over fiber system 1B shown in FIG. 4, an optical fiber 260 that transmits signal light and an optical fiber 270 that transmits feed light may be provided separately. Further, the optical fiber cable 200B may be composed of a plurality of optical fiber cables.

(2) Loss Reducing Means of Powered Device

Next, a loss reducing means of a powered device will be described.

Third Embodiment

Figure 5:
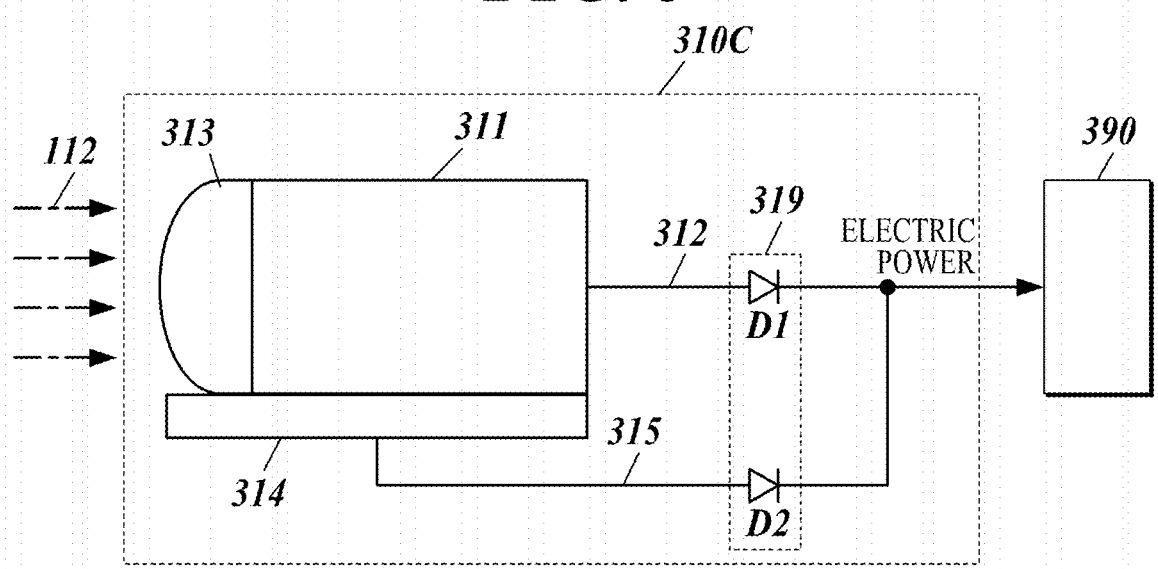
FIG. 5 is a block diagram of a powered device according to a third embodiment of the present disclosure.

FIG. 5 is a block diagram of a powered device of a third embodiment to which a loss reducing means is applied. In FIG. 5, the components same as those described above are denoted by the same reference signs, and detailed descriptions thereof are omitted.

A powered device 310C of the third embodiment includes a photoelectric conversion element 311 that receives and converts the feed light 112 into electric power, a thermoelectric conversion element 314 disposed such that heat can be conducted thereto from the photoelectric conversion element 311, a second power line 312 that transmits electric power from the photoelectric conversion element 311 to a load 390, a first power line 315 that transmits electric power from the thermoelectric conversion element 314 to the load 390, and a current backflow prevention circuit 319 disposed on the power lines 312, 315. At the light receiving side of the photoelectric conversion element 311, a lens 313 may be disposed.

The load 390 may be, for example, the data processing unit 340, another/other functional module(s), an external device(s), or any one or more of these.

The current backflow prevention circuit 319 includes, for example, backflow prevention diodes D1, D2 disposed on the respective power lines 312, 315 to prevent current from flowing from the photoelectric conversion element 311 to the thermoelectric conversion element 314 and vice versa.

Due to, for example, Seebeck effect, the thermoelectric conversion element 314 receives heat of the photoelectric conversion element 311 with one side thereof and generates a voltage. When the amount of heat generation of the photoelectric conversion element 311 increases and the thermal gradient of the thermoelectric conversion element 314 is equal to or greater than a certain value, the output voltage of the thermoelectric conversion element 314 increases. When the output voltage of the thermoelectric conversion element 314 exceeds a predetermined voltage, current flows through the backflow prevention diode D2, so that electric power is output from the thermoelectric conversion element 314 to the load 390. A voltage boost circuit that generates a high voltage from a low output voltage of the thermoelectric conversion element 314 and sends the high voltage to the load 390 may be disposed on the first power line 315.

As described above, according to the powered device 310C of the third embodiment, the heat that the photoelectric conversion element 311 generates by receiving the feed light 112 is converted into electric power by the thermoelectric conversion element 314, and the electric power is supplied to the load 390. This can reduce energy loss of the powered device 310C.

There may be a case where the load or the light amount of the feed light 112 fluctuates, and an excess or a deficiency is generated in the feed light 112. In such a case, due to conversion into electric power that is performed by the thermoelectric conversion element 314, heat generated from excess feed light 112 is converted, at a later time, into electric power by the thermoelectric conversion element 314. The electric power obtained by this conversion can be supplied to the load 390 at the timing when a deficiency is generated in the feed light 112. Thus, according to the powered device 310C of the third embodiment, an effect of equalizing an excess of the feed light 112 with a deficiency of the feed light 112 can be obtained.

The powered device 310C of the third embodiment is applicable to any of the power over fiber systems 1A, 1, 1B respectively shown in FIG. 1, FIG. 2 and FIG. 4 by replacing the powered device 310 shown in FIG. 1, FIG. 2 or FIG. 4.

Fourth Embodiment

Figure 6:
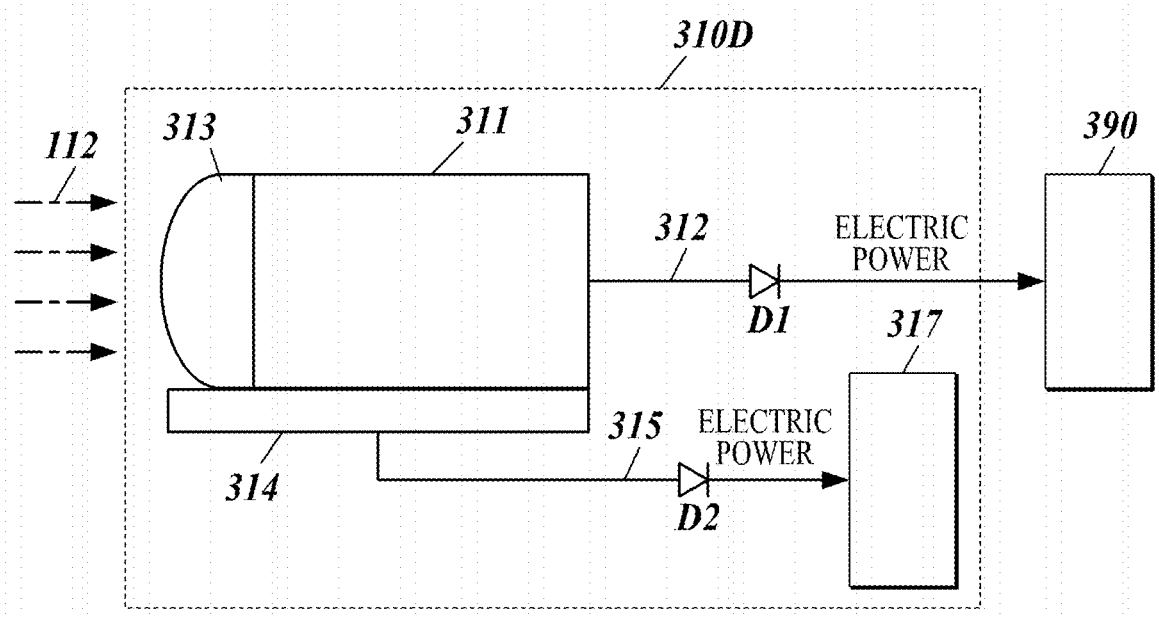
FIG. 6 is a block diagram of a powered device according to a fourth embodiment of the present disclosure.

FIG. 6 is a block diagram of a powered device according to a fourth embodiment to which a loss reducing means is applied. In FIG. 6, the components same as those described above are denoted by the same reference signs, and detailed descriptions thereof are omitted.

A powered device 310D of the fourth embodiment includes, in addition to the components of the third embodiment, an abnormality handling part 317 that handles abnormalities when they occur. The abnormalities includes the photoelectric conversion element 311 becoming hot (high temperature). The abnormality handling part 317 is part of load. In the fourth embodiment, the first power line 315 is connected to the abnormality handling part 317, so that electric power is transmitted from the thermoelectric conversion element 314 to the abnormality handling part 317.

The abnormality handling part 317 is, for example, a cooling fan and cools the photoelectric conversion element 311 generating heat abnormally and components therearound. Alternatively, the abnormality handling part 317 may be a communication device that, for example, outputs a request signal to the power sourcing equipment 110 on the basis of abnormal heat generation of the photoelectric conversion element 311 to request the power sourcing equipment 110 to stop outputting the feed light 112. The communication device may be configured to output the signal via a metallic line, radio or an optical fiber. Still alternatively, the abnormality handling part 317 may be an imaging device that, when a light receiver of the powered device 310D generates heat abnormally, outputs the heat generating portion as an image signal.

According to this configuration, if the photoelectric conversion element 311 generates heat abnormally, by making use of this heat, a process to handle the abnormality can be performed. For example, the heat generating portion is cooled by a cooling fan, output of the feed light 112 is stopped, or the heat generating portion is output as an image.

There may be a case where the photoelectric conversion element 311 goes wrong, but the feed light 112 keeps being input thereto. In this case, while electric power supply from the photoelectric conversion element 311 decreases or stops due to the breakdown, the feed light 112 keeps being input thereto, so that the photoelectric conversion element 311 generates heat abnormally. In such a case, if the abnormality handling part 317 is driven with electric power output from the photoelectric conversion element 311 only, the abnormality handling part 317 may not be driven normally due to the decrease in the electric power. However, in the powered device 310D of the fourth embodiment, the abnormality handing part 317 is driven with electric power from the thermoelectric conversion element 314, and hence, even in such a case, can handle abnormalities.

In the powered device 310D of the fourth embodiment, the first power line 315 of the thermoelectric conversion element 314 is connected to the abnormality handling part 317 without merging with the second power line 312 of the photoelectric conversion element 311. However, in the fourth embodiment, as in the powered device 310C of the third embodiment, it is possible that the power lines 312, 315 merge with one another, and electric power is supplied to the abnormality handling part 317 through the merged power line.

The powered device 310D of the fourth embodiment is applicable to any of the power over fiber systems 1A, 1, 1B respectively shown in FIG. 1, FIG. 2 and FIG. 4 by replacing the powered device 310 shown in FIG. 1, FIG. 2 or FIG. 4.

Although some embodiments of the present disclosure have been described above, these embodiments are made for purposes of illustration and example only. The present invention can be carried out in various other forms, and each component may be omitted, replaced or modified/changed within a range not departing from the scope of the present invention.

INDUSTRIAL APPLICABILITY

The present disclosure is applicable to a powered device and a power over fiber system.

REFERENCE SIGNS LIST

1A Power over Fiber System
1 Power over Fiber System
1B Power over Fiber System
100 First Data Communication Device
110 Power Sourcing Equipment
111 Semiconductor Laser for Power Supply
112 Feed Light
120 Transmitter
125 Signal Light
130 Receiver
140 Light Input/Output Part
141 Optical Connector
200A Optical Fiber Cable
200 Optical Fiber Cable
200B Optical Fiber Cable
210 Core
220 Cladding
250A Optical Fiber
250 Optical Fiber
260 Optical Fiber
270 Optical Fiber
300 Second Data Communication Device
310 Powered Device
310C Powered Device
310D Powered Device
311 Photoelectric Conversion Element
312 Second Power Line
314 Thermoelectric Conversion Element
315 First Power Line
317 Abnormality Handling Part
319 Current Backflow Prevention Circuit
D1, D2 Backflow Prevention Diode
320 Transmitter
325 Signal Light
330 Receiver
350 Light Input/Output Part
351 Optical Connector
390 Load

The invention claimed is:

1. A powered device comprising:
a photoelectric conversion element configured to receive and convert feed light into electric power;
a thermoelectric conversion element configured to receive conducted thereto from the photoelectric conversion element, and convert the received heat into electric power;
a first power line configured to transmit, to a load, the electric power obtained by the thermoelectric conversion element; and
an abnormality handling part configured to handle abnormal heat generation of the photoelectric conversion element,
wherein the first power line is configured to transmit the electric power from the thermoelectric conversion element to the abnormality handling part.

2. The powered device according to claim 1, further comprising:
a current backflow prevention circuit; and
a second power line configured to transmit, to the load, the electric power obtained by the photoelectric conversion element,
wherein the first power line is connected, via the current backflow prevention circuit, to the second power line.

3. The powered device according to claim 1, wherein the abnormality handling unit includes a fan configured to, in response to the abnormal heat generation of the photoelectric conversion element, cool the photoelectric conversion element generating heat abnormally.

4. The powered device according to claim 1, wherein the abnormality handling unit includes a communication device configured to, in response to the abnormal heat generation of the photoelectric conversion element, output a request signal to a power sourcing equipment to request the power sourcing equipment to stop outputting the feed light.

5. The powered device according to claim 1, wherein the abnormality handling unit includes an imaging device that is configured to, in response to the abnormal heat generation of the photoelectric conversion element, output an image indicating a heat generating portion of the photoelectric conversion element.

6. The powered device according to claim 1, wherein the abnormality handling unit is part of the load.

7. A power over fiber system comprising:
a power sourcing equipment configured to transmit feed light through an optical fiber; and
a powered device, the powered device configured to receive the feed light through the optical fiber,
wherein
the powered device includes
a photoelectric conversion element configured to receive and convert the feed light into electric power;
a thermoelectric conversion element configured to receive heat conducted thereto from the photoelectric conversion element, and convert the received heat into electric power;
a first power line configured to transmit, to a load, the electric power obtained by the thermoelectric conversion element; and
an abnormality handling part configured to handle abnormal heat generation of the photoelectric conversion element, and
the first power line is configured to transmit the electric power from the thermoelectric conversion element to the abnormality handling part.

8. The power over fiber system according to claim 7, wherein
the powered device further includes
a current backflow prevention circuit; and
a second power line configured to transmit, to the load, the electric power obtained by the photoelectric conversion element, and
the first power line is connected, via the current backflow prevention circuit, to the second power line.

9. The power over fiber system according to claim 7, wherein the abnormality handling unit includes a fan configured to, in response to the abnormal heat generation of the photoelectric conversion element, cool the photoelectric conversion element generating heat abnormally.

10. The power over fiber system according to claim 7, wherein the abnormality handling unit includes a communication device configured to, in response to the abnormal heat generation of the photoelectric conversion element, output a request signal to the power sourcing equipment to request the power sourcing equipment to stop outputting the feed light.

11. The power over fiber system according to claim 7, wherein the abnormality handling unit includes an imaging device that is configured to, in response to the abnormal heat generation of the photoelectric conversion element, output an image indicating a heat generating portion of the photoelectric conversion element.

12. The power over fiber system according to claim 7, wherein the abnormality handling unit is part of the load.

* * * * *